United States Patent
Koyama

(10) Patent No.: US 6,381,723 B1
(45) Date of Patent: Apr. 30, 2002

(54) ERROR CORRECTION DEVICE FOR CORRECTING ERROR IN INPUT SYMBOL STRING

(75) Inventor: Masayuki Koyama, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/409,350

(22) Filed: Sep. 30, 1999

(30) Foreign Application Priority Data

Apr. 30, 1999 (JP) ............................................ 11-123480

(51) Int. Cl.[7] .......................... H03M 13/00; H04L 1/18
(52) U.S. Cl. .................... 714/751; 714/784; 714/785; 714/789
(58) Field of Search ................................ 714/751, 781, 714/782, 783, 784, 785, 786, 787, 788, 789, 757

(56) References Cited

U.S. PATENT DOCUMENTS 5,570,378 A * 10/1996 Inoue et al. ................. 714/785
5,910,960 A * 6/1999 Claydon et al. ............. 714/784
6,209,115 B1 * 3/2001 Truong et al. ............... 714/784

FOREIGN PATENT DOCUMENTS

| JP | 5-206992 | 8/1993 |
|----|----------|--------|
| JP | 6-164424 | 6/1994 |
| JP | 7-183874 | 7/1995 |
| JP | 8-125550 | 5/1996 |

* cited by examiner

*Primary Examiner*—Emmanuel L. Moise
(74) *Attorney, Agent, or Firm*—McDermott, Will & Emery

(57) ABSTRACT

In an error correction device, a chain search operation unit supplies a symbol string which has undergone error correction to a first FILO unit and supplies a symbol string which has not undergone error correction to a second FILO unit. A recovery process unit couples the first FILO unit with a de-randomizer if the error correction is normally performed and couples the second FILO unit with the de-randomizer if the error correction is not normally performed. The bit error rate is accordingly reduced compared with that of conventional devices which supply a symbol string subjected to error correction to a de-randomizer whether or not the error correction is normally made.

9 Claims, 13 Drawing Sheets

ERROR CORRECTION DEVICE FOR CORRECTING ERROR IN INPUT SYMBOL STRING

BACKGROUND OF THE INVENTION

1. Field of the Invention

The present invention relates to error correction devices, and particularly to an error correction device which corrects an error in a string of symbols supplied via a data transmission line.

2. Description of the Background Art

In the field of digital communication, FEC (Forward Error Correction) technique using the, Reed-Solomon code has been employed as a technique for reducing errors which occur in a data transmission line.

FIG. 14 is a block diagram illustrating an error correction device of a receiver employing the FEC technique. Referring to FIG. 14, a code $\phi 31$ which is demodulated by a demodulator (not shown) is supplied to a synchronization control unit 31. Code $\phi 31$ includes a plurality of code blocks each including a plurality of symbols, and a leading symbol is used as a synchronization code (see FIG. 2). The synchronization code has a predetermined data value.

Referring to FIG. 15, synchronization control unit 31 includes an FIFO unit 40 which delays code $\phi 31$ by one code block, and an equal/unequal detection unit 41 which detects whether or not a data value of an input symbol of FIFO unit 40 equals to a data value of an output symbol thereof and outputs an equality detection signal $\phi 41$ if those values are equal to each other. Equality detection signal $\phi 41$ is output when a synchronization code of a code block and a synchronization code of a following code block are respectively located at an input portion and an output portion of FIFO unit 40. Based on equality detection signal $\phi 41$, a clock signal synchronized with the code block is generated, and the clock signal is supplied to the entire error correction device.

Code $\phi 31$ passed through synchronization control unit 31 is de-interleaved by a de-interleaver 32 and supplied to a chain search operation unit 36 via an FIFO and FILO unit 35 and to a syndrome operation unit 33. Data obtained by syndrome operation unit 33 is supplied to an Euclidean operation unit 34 and data obtained by Euclidean operation unit 34 is supplied to chain search operation unit 36.

An output symbol string of FIFO and FILO unit 35 is subjected to an error correction process by chain search operation unit 36. The symbol string which has undergone the error correction process is input to a de-randomizer 38 via a FILO unit 37, de-randomized by de-randomizer 38 and then transmitted to any circuit in the following stage.

FIG. 16 illustrates a problem of the error correction device shown in FIG. 14. Referring to FIG. 16, the axis of abscissas represents C/N (db) in the data transmission line, where the noise of the transmission line becomes lower in the direction of the arrow (to the right). The axis of ordinates represents the bit error rate of a transmission and reception system, where the bit error rate becomes higher in the direction of the arrow (toward the top).

The curve E represents a relation between the C/N and the bit error rate of a system which does not employ the FEC technique. It can be found by curve E that the bit error rate becomes higher as the noise of the data transmission line increases.

The curve F represents a relation between the C/N and the bit error rate of a system which employs the FEC technique. As shown by curve F, it can be found that the system employing the FEC technique has a lower bit error rate in the region "b" where the noise in the data transmission line is relatively low. However, in the region "a" where the noise in the data transmission line is relatively high, the system employing the FEC technique has a higher bit error rate. The reason is that the error correction device often fails to normally perform the correction process if the noise in the data transmission line exceeds a certain level.

SUMMARY OF THE INVENTION

One object of the present invention is to provide an error correction device having a low bit error rate.

According to one aspect of the invention, the error correction device includes a delay circuit which delays a symbol string which has not been subjected to error correction, and a delay circuit which delays a symbol string which has been subjected to error correction. If the error correction is not normally done, an output symbol string of the former delay circuit is supplied to a circuit in a following stage. If the error correction is normally done, an output symbol string of the latter delay circuit is supplied to the circuit in the following stage. Accordingly, the bit error rate is decreased compared with conventional error correction devices which supply to a circuit in a following stage a symbol string which has undergone error correction whether or not the error correction is normally performed.

According to another aspect of the invention, an error correction device includes a delay circuit which delays a symbol string which has been subjected to error correction and a holding circuit which holds the number of a symbol subjected to error correction and a data value thereof before correction. If the error correction is normally done, an output symbol string of the delay circuit is directly supplied to a circuit in a following stage. If the error correction is not normally done, a data value of an erroneously corrected symbol in the output symbol string of the delay circuit is re-corrected to the data value before correction, and the re-corrected symbol string is supplied to the circuit in the following stage. Accordingly, the bit error rate is decreased compared with conventional error correction devices which supply to a circuit in a following stage a symbol string which has undergone error correction whether or not the error correction is normally carried out.

According to still another aspect of the invention, an error correction device includes a delay circuit which delays a symbol string which has been subjected to error correction, a holding circuit which holds the number of a symbol subjected to error correction, a data value thereof, and a data value used for the correction, and an arithmetic operation circuit which determines a data value before correction based on the data value after the correction and the data value used for the correction that are held by the holding circuit. If the error correction is normally done, an output symbol string of the delay circuit is directly supplied to a circuit in a following stage. If the error correction is not normally done, a data value of a symbol of an erroneously corrected signal in the output symbol string of the delay circuit is re-corrected to the data value before the correction determined by the arithmetic operation circuit, and the re-corrected symbol string is supplied to the circuit in the following stage. Accordingly, the bit error rate is decreased compared with conventional error correction devices which supply to a circuit in a following stage a symbol string which has undergone error correction whether or not the error correction is normally made.

Preferably, each symbol string includes a predetermined number N of symbols, the leading symbol of each symbol string is used as a synchronization code, and a synchronization control circuit is further provided. The synchronization control circuit detects a symbol having a data value which is the same as that of the synchronization code. If the Nth symbol counted from a symbol next to the detected symbol is the synchronization code, the Nth symbol is determined as the leading symbol. The conventional FIFO unit is unnecessary in this case, and the circuit scale accordingly decreases.

Still preferably, the synchronization control circuit determines whether the Nth symbol counted from a symbol next to the symbol determined as the leading symbol has the same data value as that of the synchronization code. The circuit counts the number of positive results A and negative results B of the determination. If the ratio of positive results A to the total number of determinations A+B, i.e. A/(A+B) exceeds a predetermined threshold, a data value of a symbol with the negative result is corrected to the data value of the synchronization code. In this case, the error in the leading symbol is also corrected and the bit error rate is further decreased.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
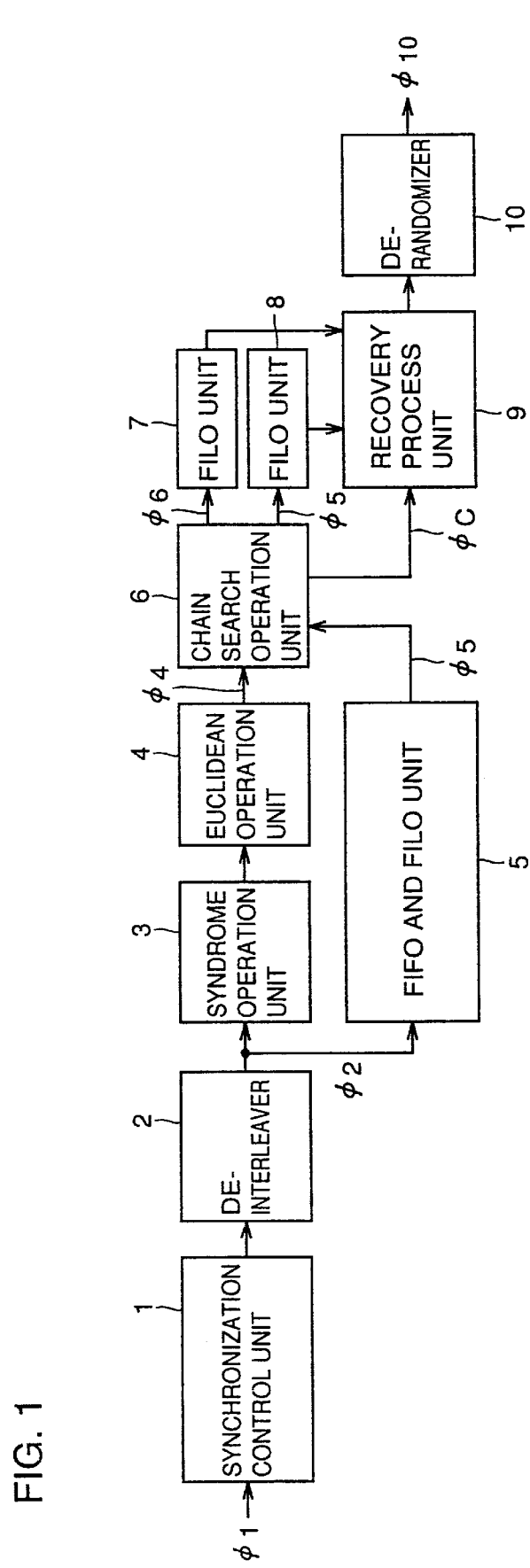
FIG. 1 is a block diagram showing a structure of an error correction device of a receiver in the first embodiment of the invention.

FIG. 1 is a block diagram showing an error correction device of a receiver in the first embodiment of the invention.

Referring to FIG. 1, the error correction device includes a synchronization control unit 1, a de-interleaver 2, a syndrome operation unit 3, an Euclidean operation unit 4, an FIFO and FILO unit 5, a chain search operation unit 6, FILO units 7 and 8, a recovery process unit 9, and a de-randomizer 10.

Figure 2:
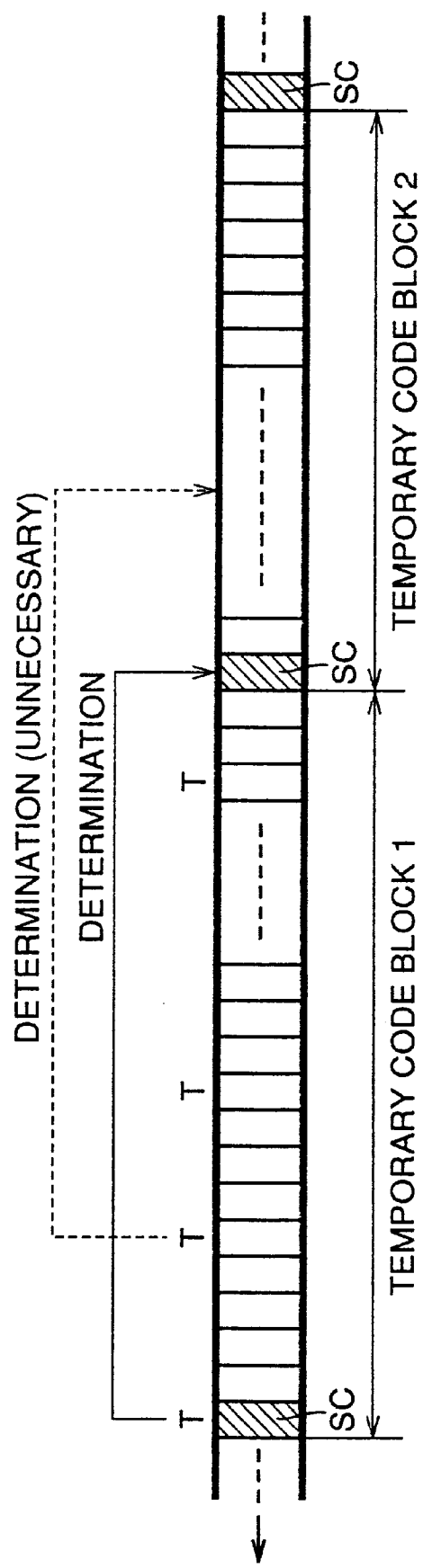
FIG. 2 illustrates a Reed-Solomon code supplied to the error correction device shown in FIG. 1.

A Reed-Solomon code 1 demodulated by a demodulator (not shown) is supplied to synchronization control unit 1. Code φ1 includes a plurality of code blocks as shown in FIG. 2. Each code block includes a plurality of (e.g. 204) symbols (data codes). Each symbol has 8-bit data. The leading symbol of each code block is a synchronization code SC. A predetermined data value (e.g. 01000111) is allocated to synchronization code SC.

Synchronization control unit 1 generates a clock signal which is synchronous with synchronization code SC of code φ1 and supplies the clock signal to the entire error correction device. The error correction device operates synchronously with the clock signal.

Figure 3:
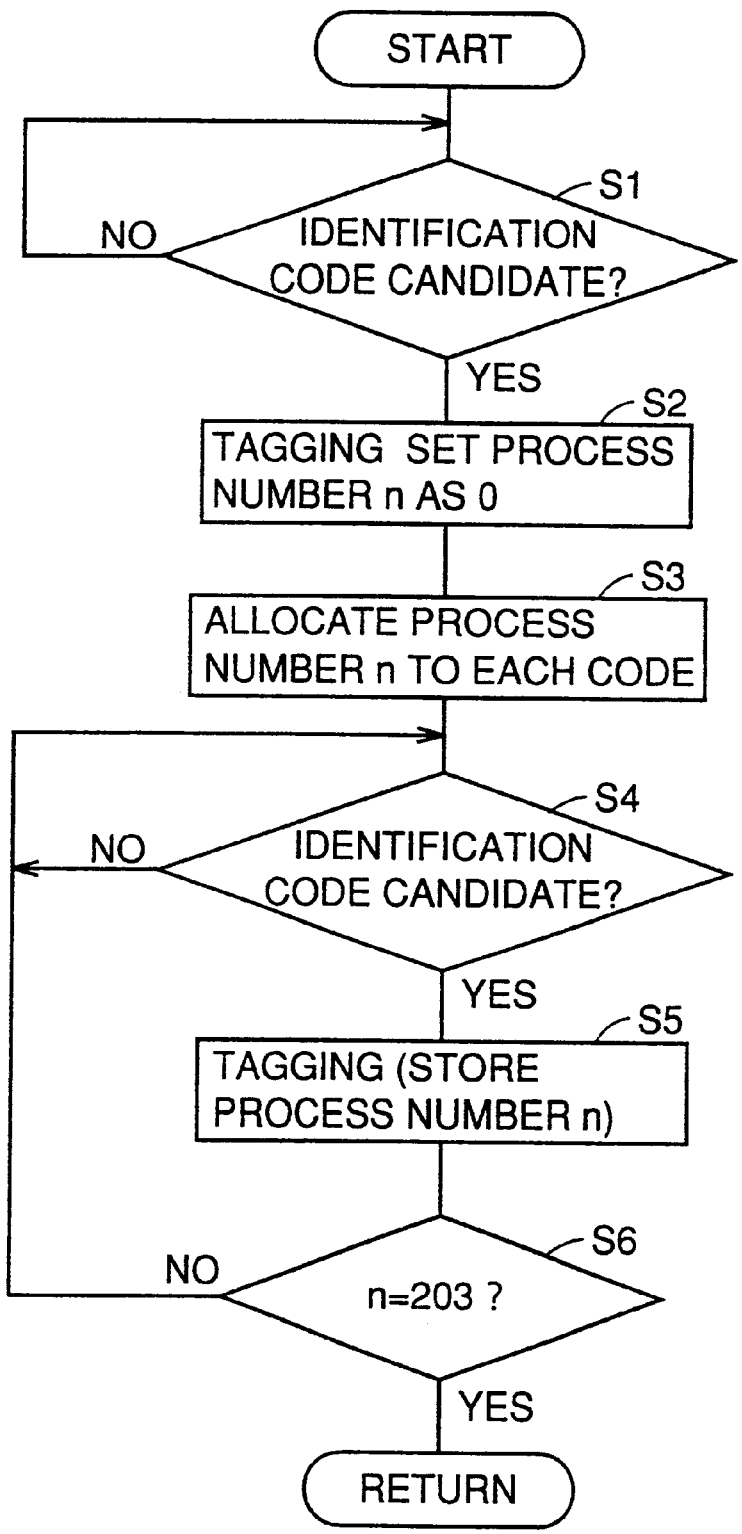
FIG. 3 flow chart illustrating an operation of a synchronization control it shown in FIG. 1.

An operation of synchronization control unit 1 is now described. Referring to FIG. 3, synchronization control unit 1 first reads a data value of each symbol of code φ1 to detect an identification code candidate which has the data value of 01000111 in step S1. The identification code is highly probably synchronization code SC. Instead, the code may be a symbol having ordinary information.

Synchronization control unit 1 then temporarily decides the firstly detected identification code as synchronization code SC, allocates a process number 0 to the identification code and tags the code (stores process number 0) in step S2, and allocates process numbers 1 to 203 respectively to following 203 symbols in step S3.

In step 4, synchronization control unit 1 determines whether or not each symbol is the identification code. If a symbol is the identification code, the symbol is tagged in step S5 (its process number is stored). If not, step 4 is performed. In step S6, synchronization control unit 1 determines whether or not n equals to 203. If not, step S4 is performed. If n equals to 203, the operation of detecting the identification code in a temporary code block 1 is stopped.

Figure 4:
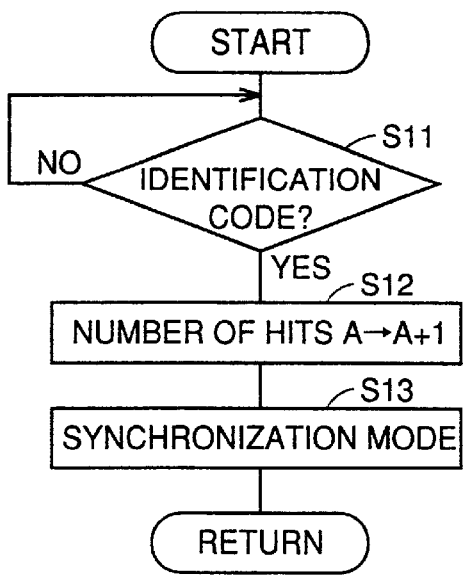
FIG. 4 is another flow chart illustrating an operation of thesynchronization control unit shown in FIG. 1.

Referring to FIG. 4, synchronization control unit 1 determines in step S11 whether or not a symbol in a temporary code block 2 having the process number stored in steps S2 and S5 is the identification code (01000111). If the symbol is the identification code, the number of hits A is incremented (+1) in step S12, and a synchronization mode starts in step S13. Synchronization control unit 1 generates a clock signal synchronized with the identification code and supplies the clock signal to the entire error correction device. FIG. 2 shows a case in which the firstly detected identification code is synchronization code SC.

Figure 5:
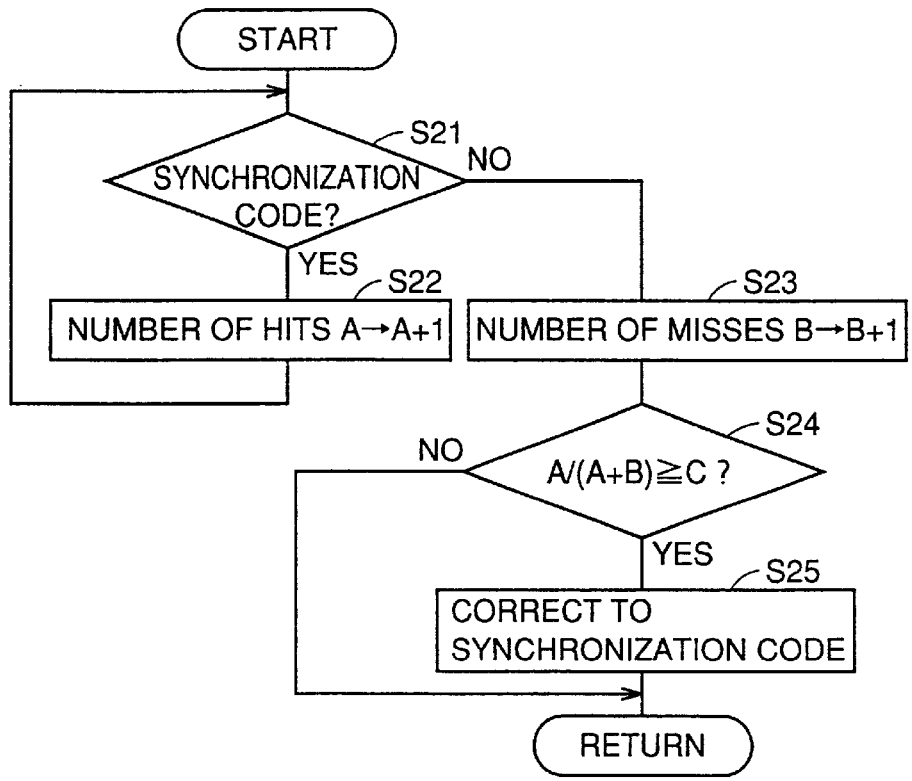
FIG. 5 is still another flow chart illustrating an operation of the synchronization control unit shown in FIG. 1.

Referring to FIG. 5, after the synchronization mode is started, it is detected that whether or not the leading symbol of each code block is synchronization code SC in step S21. If the leading symbol is synchronization code SC, the number of hits A is incremented in step S22. If not, the number of misses B is incremented in step S23.

In step S24, synchronization control unit 1 determines whether or not the probability of hit A/(A+B) is equal to or more than a predetermined threshold C. If the probability is equal to or more than the threshold, the probability of occurrence of an error in the symbol is high. Accordingly, the symbol is corrected to the synchronization code in step S25 and then step S21 is performed. If the probability is less than threshold C, no correction is made to the symbol and step S21 is carried out again.

Synchronization control unit 1 does not employ the conventional large FIFO unit 40 and thus has a small circuit scale. The bit error rate decreases since the error in synchronization code SC is corrected.

The error correction cannot be executed normally if a plurality of successive symbols respectively have errors in a transmission line. Therefore, referring again to FIG. 1, de-interleaver 2 is employed for changing the order of symbols based on a predetermined rule to disperse a plurality of symbols having errors. Specifically, the order of symbols is changed according to a predetermined rule by an interleaver of a transmitter (not shown), a string of symbols arranged in the changed order is used for data transmission, and the order of symbols is changed to the original one by de-interleaver 2 of the receiver. In such a way, a plurality of symbols having errors occurred in data transmission can be dispersed.

Syndrome operation unit 3 multiplies the symbol string passed from de-interleaver 2 by a plurality of different constants to obtain syndrome data showing the state of errors. Based on the syndrome data supplied from syndrome operation unit 3, Euclidean operation unit 4 solves an error number polynomial and an error position polynomial.

FIFO and FILO unit 5 having the same delay time as that of syndrome operation unit 3 and Euclidean operation unit 4 inverts the order of symbols of a symbol string $\phi 2$ supplied from de-interleaver 2 and applies the string to chain search operation unit 6. The reason why the order of symbols is inverted is that the symbol order is inverted by Euclidean operation unit 4 and thus the symbol order supplied from FIFO and FILO unit 5 to chain search operation unit 6 should be agreed with the symbol order supplied from Euclidean operation unit 4 to chain search operation unit 6.

Figure 6:
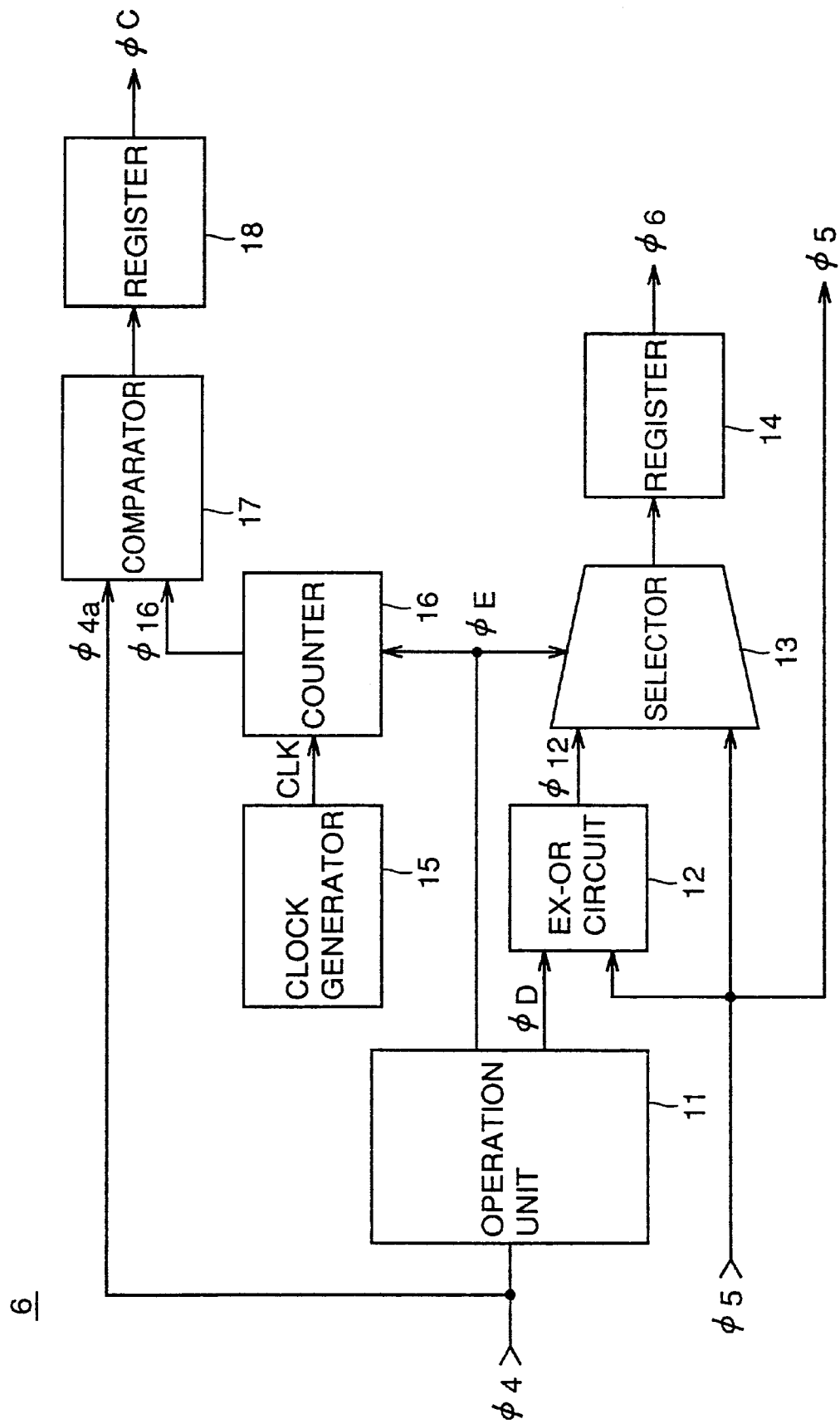
FIG. 6 is a block diagram showing a structure of a chain search operation unit shown in FIG. 1.

Referring to FIG. 6, chain search operation unit 6 includes an arithmetic operation unit 11, an EX-OR circuit 12, a selector 13, registers 14 and 18, a clock generator 15, a counter 16 and a comparator 17. Based on output data $\phi 4$ of Euclidean operation unit 4, operation unit 11 generates a signal $\phi E$ which designates the number of a symbol $\phi 5a$ having an error to be corrected in an output symbol string $\phi 5$ of FIFO and FILO unit 5, and a data code $\phi D$ for correcting symbol $\phi 5a$.

EX-OR circuit 12 generates an exclusive OR signal $\phi 12$ based on data code $\phi D$ from operation unit 11 and symbol string $\phi 5$ from FIFO and FILO unit 5. Selector 13 is controlled by signal $\phi E$ from operation unit 11, and passes an output symbol $\phi 12a$ from EX-OR circuit 12 instead of symbol $\phi 5a$ designated by signal $\phi E$. In other cases, selector 13 passes symbols from FIFO and FILO unit 5. Register 14 temporarily holds a symbol string $\phi 6$ passed through selector 13 and supplies it to FILO unit 7.

Clock generator 15 operates in synchronization with each symbol in symbol string $\phi 5$, generates a clock signal CLK having the same cycle as that of each symbol and supplies it to counter 16. Counter 16 is reset in the first clock cycle of each symbol string $\phi 5$ (i.e. the period in which the synchronization code of each code block is input). Counter 16 is controlled by signal $\phi E$, counts the pulse number of clock signal CLK during a period in which signal $\phi E$ designates a symbol with an error to be corrected, and holds the count value without counting the pulse number of clock signal CLK during a period in which signal $\phi E$ does not designate a symbol with an error to be corrected. Accordingly, a count value $\phi 16$ of counter 16 in the last clock cycle of each symbol string $\phi 15$ corresponds to the number of corrections in symbol string $\phi 15$.

Comparator 17 compares count value $\phi 16$ of counter 16 with a degree $\phi 4a$ of an error position polynomial corresponding to each symbol string $\phi 5$ contained in signal $\phi 4$. If they match with each other, an "H" level signal is output. If not, an "L" level signal is output.

Register 18 holds an output level of comparator 17 in the last clock cycle of each symbol string $\phi 5$. An output of register 18 is a signal $\phi C$. In this way, if the degree of the error position polynomial matches with the number or corrections, "H" level signal $\phi C$ indicating that the correction process is normally carried out is output. If the degree of the error position polynomial does not match with the number of corrections, "L" level signal $\phi C$ indicating that the correction process is abnormal is output.

Referring again to FIG. 1, FILO unit 7 temporarily holds symbol string $\phi 6$ subjected to the correction process by chain search operation unit 6, inverts the symbol order and supplies it to recovery process unit 9. FILO unit 8 temporarily holds symbol string $\phi 5$ from FIFO and FILO unit 5, inverts the symbol order and supplies it to recovery process unit 9. The symbol order is thus inverted in order to change the inverted symbol order by Euclidean operation unit 4 or FIFO and FILO unit 5 to the original order.

Recovery process unit 9 is controlled by signal $\phi C$ from chain search operation unit 6. If the correction process is normally conducted, an output symbol string of FILO unit 7 is supplied to de-randomizer 10. If not, an output symbol string of FILO unit 8 is supplied to de-randomizer 10.

De-randomizer 10 changes the order of symbols of a string which is changed according to a predetermined rule by a randomizer (not shown) of the transmitter to the original order. The reason why the order of symbols of a string is changed is that modulation and demodulation cannot be implemented properly if successive symbols have the same data value. Changing of the order allows the symbols having the same data value to be dispersed.

An operation of the error correction device is now described briefly. Reed-Solomon code $\phi 1$ passed from a transmitter via a transmission line and demodulated by a demodulator (not shown) is supplied to synchronization control unit 1. In synchronization control unit 1, an identification code candidate in code $\phi 1$ is detected, determination is made as to whether or not the identification candidate is the synchronization code. If the candidate is the synchronization code, a synchronization mode is started.

A symbol string passed through synchronization control unit 1 is de-interleaved by de-interleaver 2, and then supplied to chain search operation unit 6 via FIFO and FILO unit 5 and to syndrome operation unit 3. Syndrome data obtained by syndrome operation unit 3 is supplied to Euclidean operation unit 4, and data $\phi 4$ obtained by Euclidean operation unit 4 is supplied to chain search operation unit 6.

An output symbol string of FIFO and FILO unit 5 is directly supplied to FILO unit 8 via chain search operation unit 6, and supplied to FILO unit 7 after corrected by chain search operation unit 6. Chain search operation unit 6 generates signal $\phi C$ indicating if or not correction is normally made, and the generated signal is supplied to recovery process unit 9.

If the correction is normally performed, an output symbol string of FILO unit 7 is supplied to de-randomizer 10 via recovery process unit 9. If not, an output symbol string of FILO unit 8 is supplied to de-randomizer 10 via recovery process unit 9. An output symbol string $\phi 10$ is supplied to a circuit in the following stage.

Figure 7:
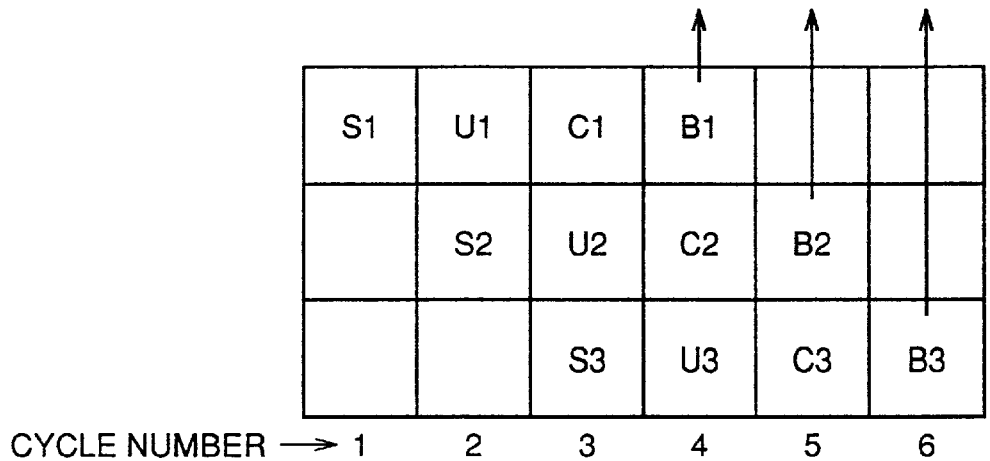
FIG. 7 illustrates timing of an error correction process of the error correction device shown in FIG. 1.

FIG. 7 illustrates the timing of an error correction process in the error correction device shown in FIGS. 1 to 6. Each time synchronization code SC shown in FIG. 2 is input, a correction process cycle is changed, and syndrome operation S, Euclidean operation U, chain search operation C and recovery process B are carried out according to the pipeline system.

Specifically, syndrome operation S1 for code block 1 is performed in Cycle 1, Euclidean operation U1 for code block 1 is performed in Cycle 2, chain search operation C1 for code block 1 is performed in Cycle 3, and recovery process B1 for code block 1 is performed in Cycle 4. In Cycle 2, syndrome operation S2 for code block 2 is performed, and in Cycle 3, Euclidean operation U2 for code block 2 is performed. Chain search operation C2 for code block 2 is performed in Cycle 4, and recovery process B2 for code block 2 is performed in Cycle 5. Syndrome operation S3 for code block 3 is performed in Cycle 3, Euclidean operation U3 for code block 3 is performed in Cycle 4, chain search operation C3 for code block 3 is performed in Cycle 5, and recovery process B3 for code block 3 is performed in Cycle 6.

In this embodiment, FILO unit 7 for holding a symbol string subjected to error correction and FILO unit 8 for holding a symbol string which is not subjected to error correction are provided. If error correction is normally carried out, an output symbol string of FILO unit 7 is transmitted to the next stage. If not, an output symbol string of FILO unit 8 is transmitted to the next stage. Consequently, a reduced bit error rate is achieved compared with that of conventional devices in which a symbol string subjected to error correction is supplied to the next stage whether the error correction is normal or not.

Figure 8:
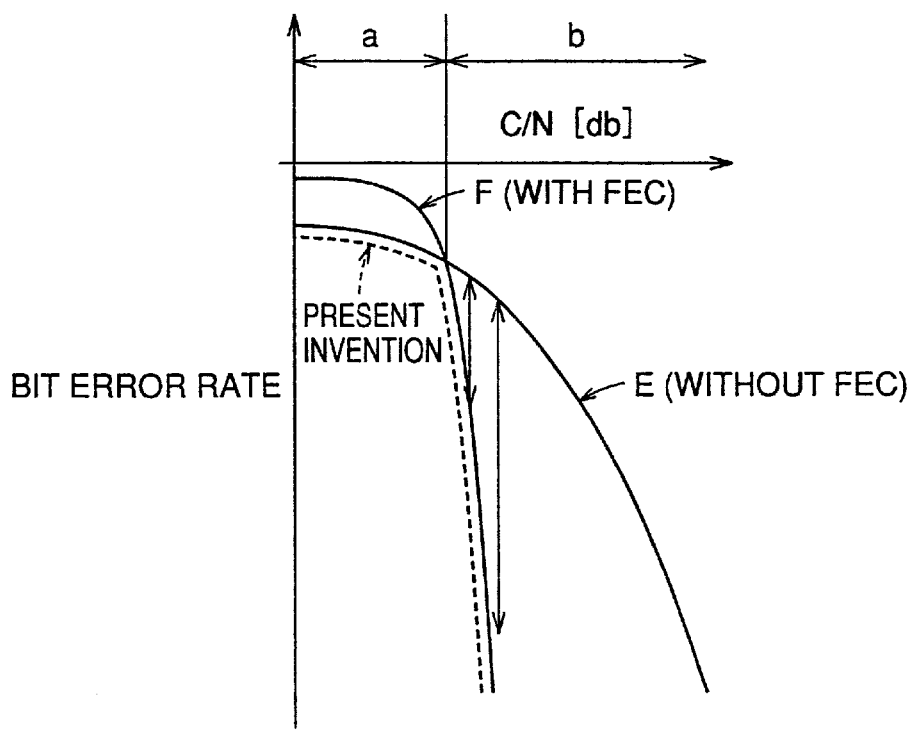
FIG. 8 illustrates an effect of the error correction device shown in FIG. 1.

The bit error rate is further reduced since synchronization control unit 1 corrects an error in the synchronization code. Using this error correction device, the bit error rate is lower in the region "a" where the noise in the transmission line is high compared with the case in which error correction is not performed (curve E) as shown in FIG. 8. In the region "b" where the noise in the transmission line is low, the bit error rate is lower compared with the case in which the conventional correction devices perform correction.

Figure 9:
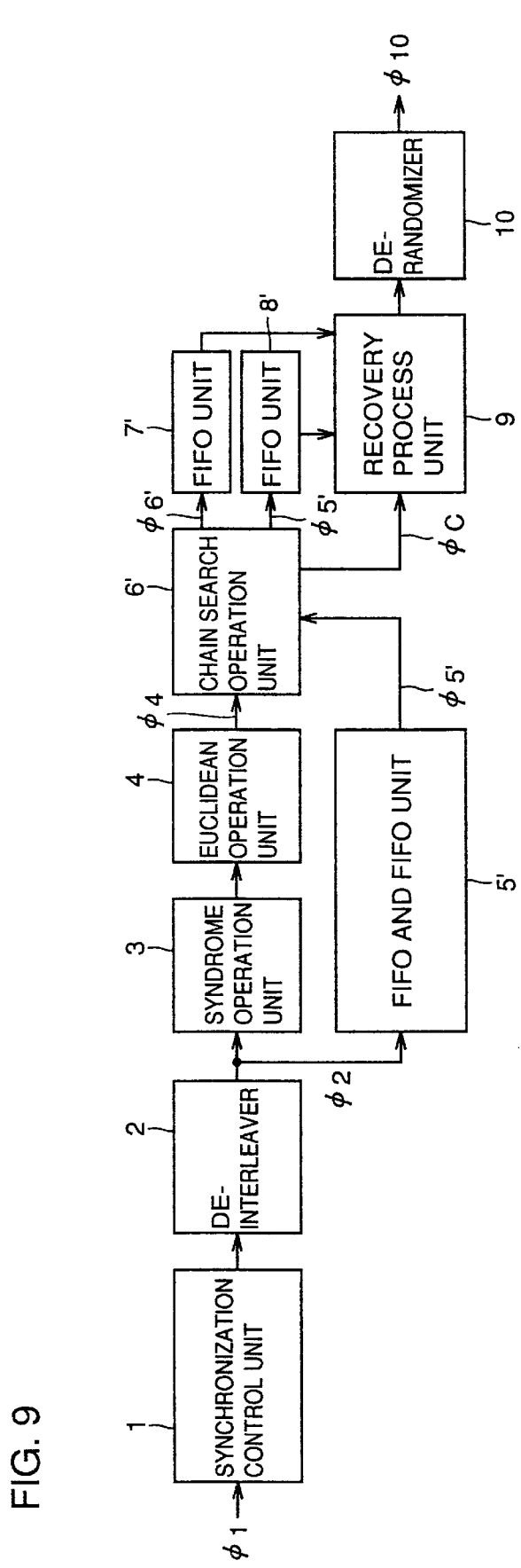
FIG. 9 is a block diagram illustrating a modification of the first embodiment.

FIG. 9 is a block diagram showing a modification of the first embodiment. According to this modification, FIFO and FILO unit 5, chain search operation unit 6 and FILO units 7 and 8 are replaced respectively with an FIFO and FIFO unit 5', a chain search operation unit 6' and FIFO units 7' and 8'. FIFO and FIFO unit 5' has the same delay time as that of a syndrome operation unit 3 and an Euclidean operation unit 4, and supplies a symbol string $\phi2$ from a de-interleaver 2 to chain search operation unit 6' without changing the order of symbols. Based on data from Euclidean operation unit 4, chain search operation unit 6' makes a correction to a symbol string $\phi5'$ supplied from FIFO and FIFO unit 5'.

FIFO unit 7' temporarily holds a symbol string $\phi6'$ which has undergone a correction process in chain search operation unit 6', and thereafter supplies it to a recovery process unit 9 without changing the order of data. FIFO unit 8' temporarily holds symbol string $\phi5'$ from FIFO and FIFO unit 5' and thereafter supplies it to recovery process unit 9 without changing the order of symbols. The structures and operations similar to those of the error correction device shown in FIG. 1 are not described here.

The difference between the modified device and the error correction device in FIG. 1 is the order of data processes, and the same effect as that of the error correction device in FIG. 1 is achieved.

Second Embodiment

Figure 10:
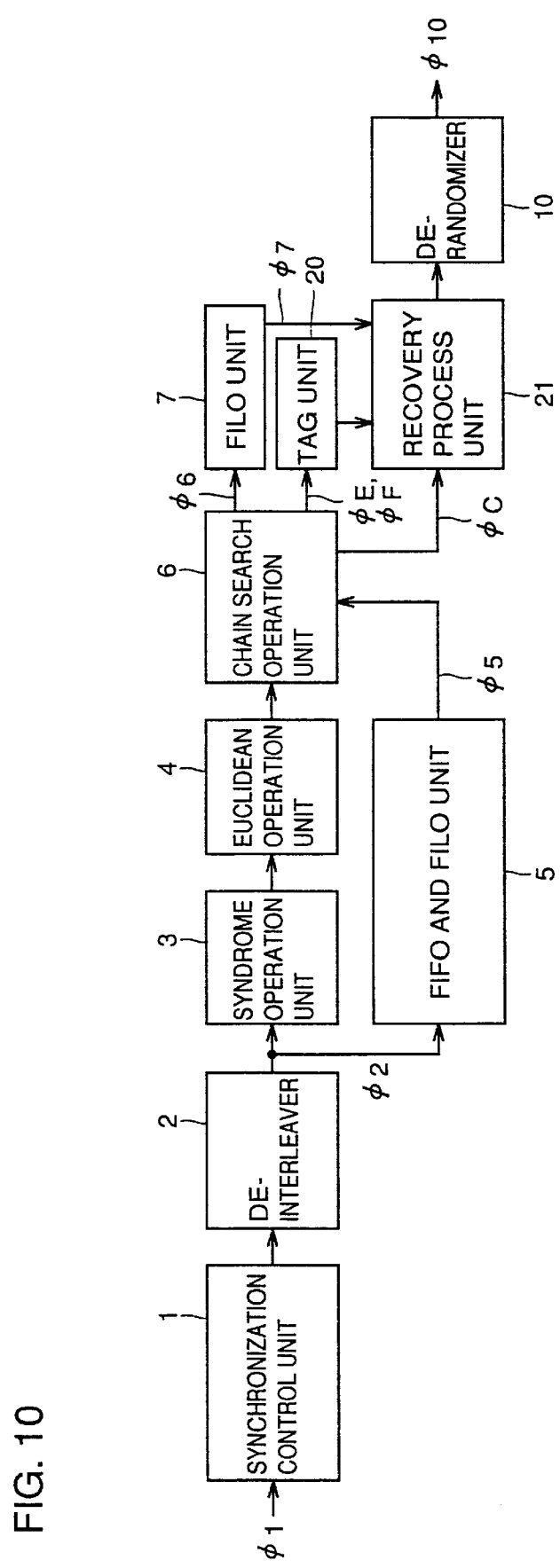
FIG. 10 is a block diagram showing a structure of an error correction device in the second embodiment of the invention.

FIG. 10 is a block diagram showing an error correction device of a receiver in the second embodiment of the invention. Referring to FIG. 10, this error correction device is different from the device shown in FIG. 1 in that a tag unit 20 and a recovery process unit 21 is substituted for FILO unit 8 and recovery process unit 9 respectively.

Tag unit 20 coupled with a chain search operation unit 6 holds a signal $\phi E$ which designates the order of a symbol $\phi5a$ to be subjected to error correction in a symbol string $\phi5$ from an FIFO and FILO unit 5 and holds a data value $\phi F$ of symbol $\phi5a$, and supplies them to recovery process unit 21. If a signal $\phi C$ from chain search operation unit 6 indicates that the correction is normally made, recovery process unit 21 supplies an output symbol string $\phi7$ of an FILO unit 7 directly to a de-randomizer 10.

If signal $\phi C$ from chain search operation unit 6 indicates that the correction is not normally made, recovery process unit 21 changes, based on signal $\phi E$ and data value $\phi F$ from tag unit 20, a symbol corresponding to symbol $\phi5a$ which is erroneously corrected in symbol string $\phi7$ from FILO unit 7 back to original symbol $\phi5a$, and supplies the changed one to de-randomizer 10. Consequently, an output symbol string $\phi2$ of a de-interleaver 2 is directly applied to de-randomizer 10.

Other structures and operations of this error correction device are similar to those of the device in FIG. 1 and description thereof is not repeated here.

In addition to the effect identical to that of the first embodiment, the second embodiment achieves a smaller circuit scale since FILO unit 8 is not employed.

Figure 11:
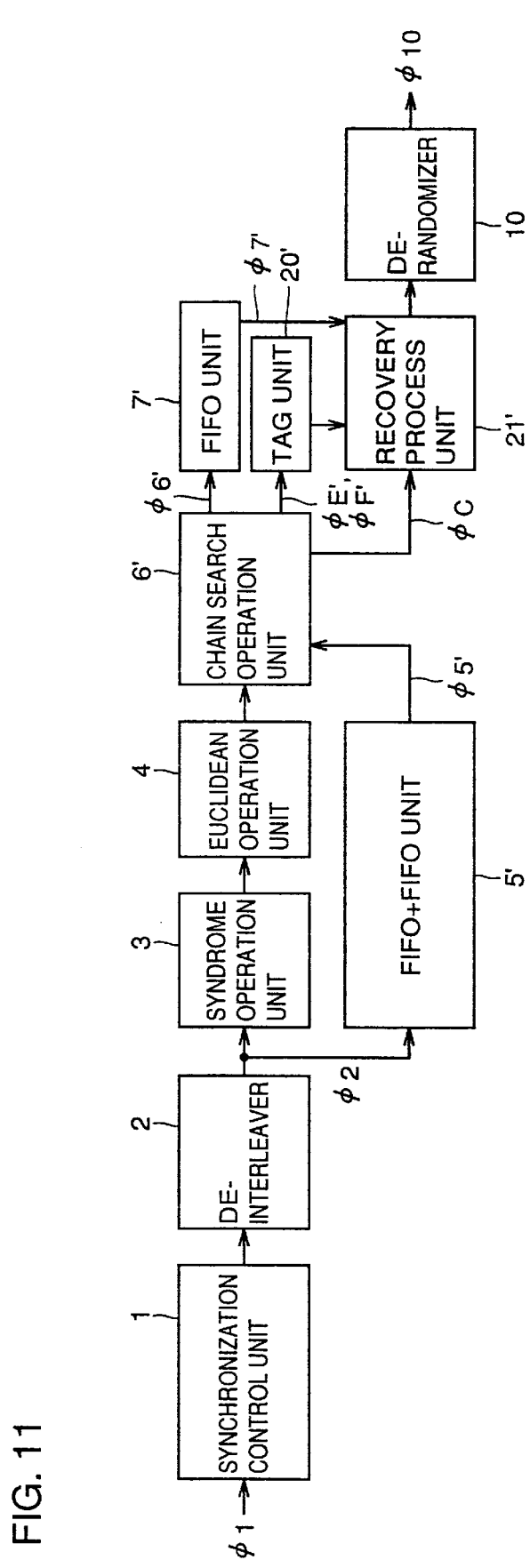
FIG. 11 is a block diagram illustrating a modification of the second embodiment.

FIG. 11 is a block diagram illustrating a modification of the second embodiment. According to this modification, FIFO and FILO unit 5, chain search operation unit 6, FILO unit 7, tag unit 20, and recovery process unit 21 are respectively replaced with a FIFO and FIFO unit 5', a chain search operation unit 6', an FIFO unit 7', a tag unit 20', and a recovery process unit 21'. FIFO and FIFO unit 5' has the same delay time as that of a syndrome operation unit 3 and a Euclidean operation unit 4, and supplies a symbol string $\phi2$ from a de-interleaver 2 to chain search operation unit 6' without changing the order of symbols. Chain search operation unit 6' make a correction to an output symbol string $\phi5'$ of FIFO and FIFO unit 5' based on data from Euclidean operation unit 4.

FIFO unit 7' temporarily holds a symbol storing $\phi6'$ which has undergone a correction process in chain search operation unit 6', and then supplies it to recovery process unit 21' without changing the order of symbols. Tag unit 20' coupled with chain search operation unit 6' holds a signal $\phi E$, designating the order of a symbol $\phi5a'$ to be subjected to error correction in output symbol string $\phi5'$ of FIFO and FIFO unit 5' and holds a data value $\phi F'$ of symbol $\phi5a'$, and supplies them to recovery process unit 21'.

If a signal $\phi C$ from chain search operation unit 6' indicates that the correction process is normally carried out, recovery process unit 21' supplies an output symbol string $\phi7'$ of FIFO unit 7' directly to de-randomizer 10. If signal $\phi C$ from chain search operation unit 6' indicates that the correction process is not normally performed, recovery process unit 21' changes a symbol which is included in output symbol string $\phi7'$ of FIFO unit 7' and erroneously corrected, based on signal $\phi E'$ and data value $\phi F'$ supplied from tag unit 20', back to original symbol $\phi5a'$ and supplies it to de-randomizer 10. As a result, an output symbol string $\phi2$ of a de-interleaver 2 is directly applied to de-randomizer 10.

According to this modification, only the order of data processes in the error correction device in FIG. 10 is changed, and accordingly, the same effect as that of the device in FIG. 10 is achieved here.

Figure 12:
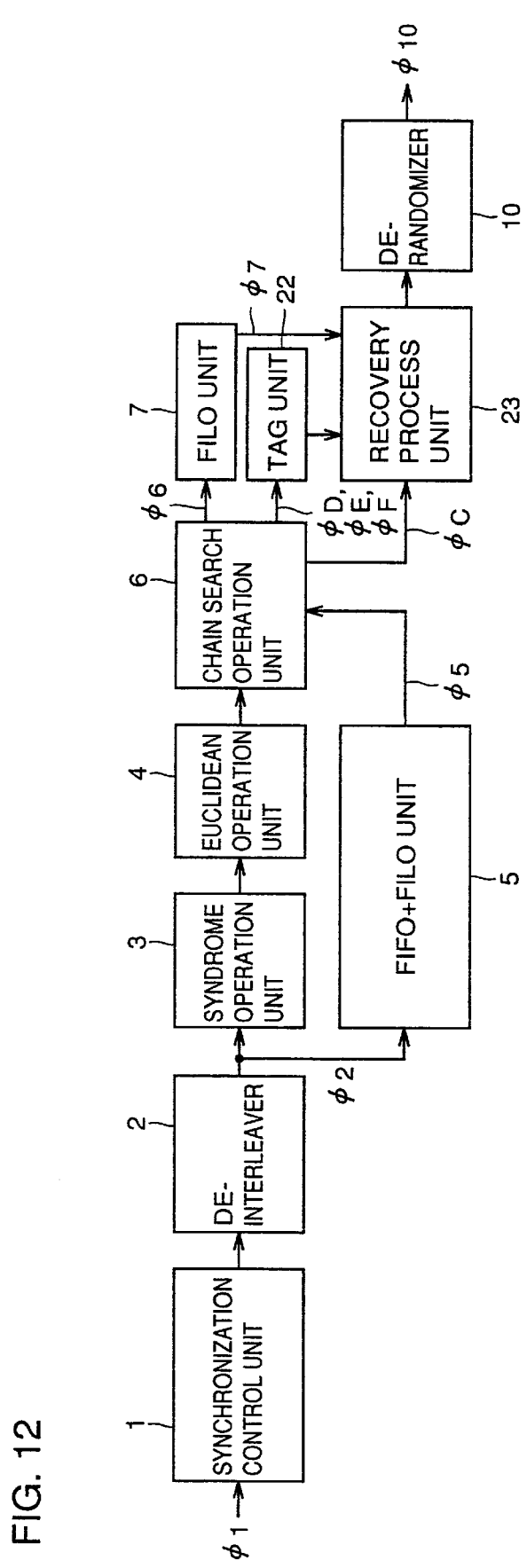
FIG. 12 is a block diagram illustrating another modification of the second embodiment.

FIG. 12 is a block diagram illustrating another modification of the second embodiment. This modification is different from the error correction device in FIG. 10 in that a tag unit 22 and a recovery process unit 23 are substituted respectively for tag unit 20 and recovery process unit 21.

Tag unit 22 is coupled with a chain search operation unit 6, holds a data code φD for correcting a symbol φ5a to be subjected to error correction in an output symbol string φ5 of an FIFO and FILO unit 5, a signal φE which designates the order of symbol φ5a, and a data value φF of a symbol φ6a obtained by correcting symbol φ5a, and supplies them to recovery process unit 23.

Recovery process unit 23 supplies an output symbol string φ7 of an FILO unit 7 directly to a de-randomizer 10 if a signal φC from chain search operation unit 6 indicates that the correction process is normally performed.

If signal φC from chain search operation unit 6 indicates that the correction process is not normally conducted, recovery process unit 23 changes an erroneously corrected symbol in output symbol string φ7 of FILO unit 7 back to original symbol φ5a based on signals φD to φF from tag unit 22, and supplies the changed one to de-randomizer 10. Consequently, a symbol string φ2 from a de-interleaver 2 is directly applied to derandomizer 10.

This modification also achieves the same effect as that of the error correction device in FIG. 10.

Figure 13:
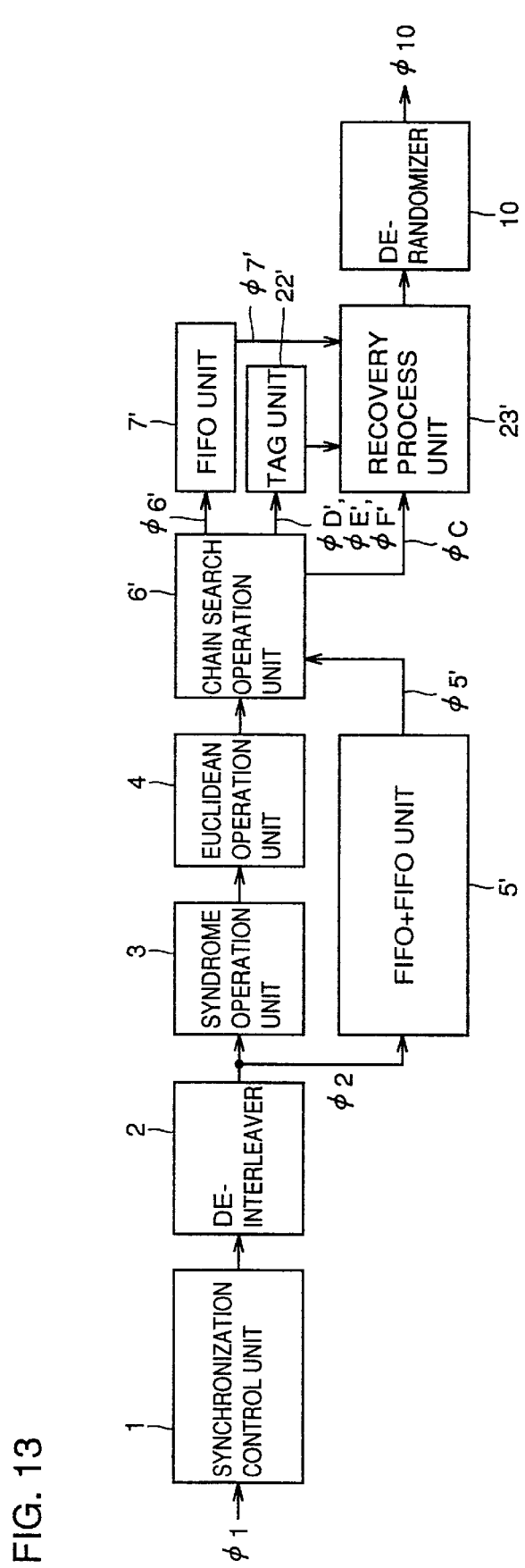
FIG. 13 is a block diagram illustrating still another modification of the second embodiment.
Figure 14:
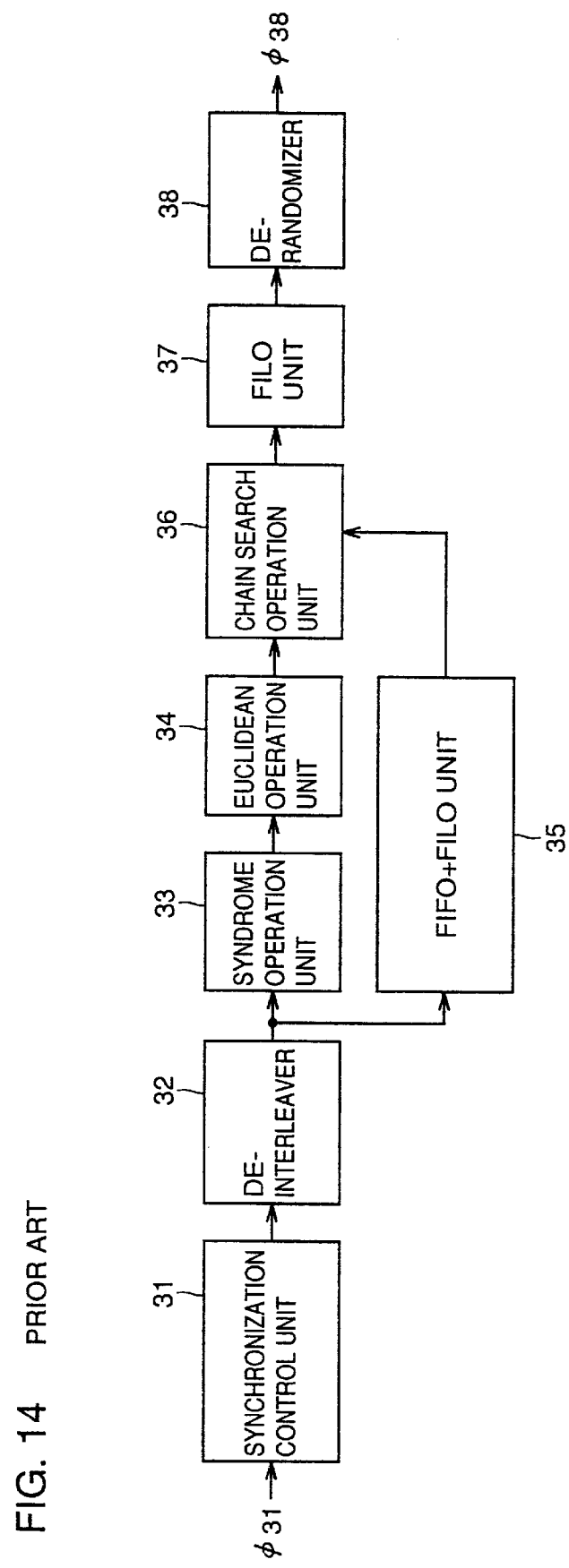
FIG. 14 is a block diagram showing a structure of a conventional error correction device.
Figure 15:
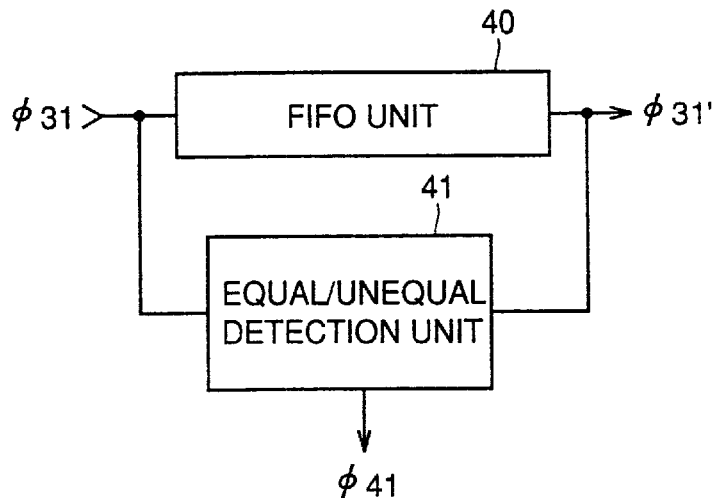
FIG. 15 is a block diagram showing a structure of a synchronization control unit shown in FIG. 14.
Figure 16:
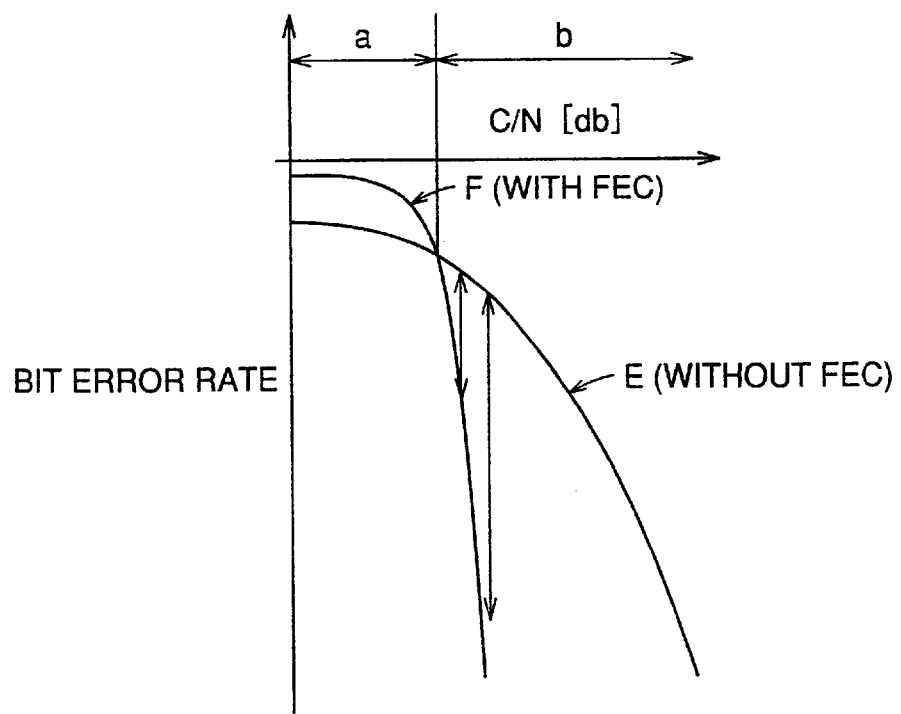
FIG. 16 illustrates a problem of the conventional error correction device.

FIG. 13 is a block diagram illustrating still another modification of the embodiment. The difference between this modification and the modification shown in FIG. 12 is that the former includes a tag unit 22' and a recovery process unit 23' instead of tag unit 22 and recovery process unit 23 respectively in the latter. According to this modification, only the order of data processes in the modification in FIG. 12 is changed, and accordingly, the same effect as that of the modification in FIG. 12 is achieved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An error correction device which corrects an error in a symbol string supplied via a data transmission line, comprising:

a first delay circuit delaying said supplied symbol string by a first time;

an error correction circuit performing a predetermined arithmetic operation on said supplied symbol string to correct an error in an output symbol string of said first delay circuit based on result of the arithmetic operation;

a determination circuit determining whether or not error correction performed by said error correction circuit is normal, outputting a first signal if the correction is normal and outputting a second signal if the correction is abnormal;

a second delay circuit delaying the output symbol string of said first delay circuit directly by a second time;

a third delay circuit delaying by a third time the symbol string output from said first delay circuit and subjected to error correction by said error correction circuit; and a switching circuit receiving output symbol strings of said second and third delay circuits, supplying the output symbol string of said third delay circuit to a circuit in a following stage in response to output of the first signal from said determination circuit, and supplying the output symbol string of said second delay circuit to the circuit in the following stage in response to output of the second signal from said determination circuit.

2. The error correction device according to claim 1, wherein a plurality of symbol strings are supplied in series, each symbol string includes a predetermined number N of symbols, a leading symbol in each symbol string is used as a synchronization code, a synchronization control circuit which detects said synchronization code to control said error correction device in synchronization with said synchronization code is provided, and said synchronization control circuit includes:

a detection unit detecting a symbol having the same data value as that of said synchronization code; and a first determination unit determining an Nth symbol counted from a symbol next to the symbol detected by said detection unit as the leading symbol if the Nth symbol has the same data value as that of said synchronization code.

3. The error correction device according to claim 2, wherein said synchronization control circuit further includes:

a second determination unit determining whether or not an Nth symbol counted from a symbol next to the symbol determined as the leading symbol by said first determination unit has the same data value as that of said synchronization code;

a count unit counting the number of positive results A and the number of negative results B of the determination by said second determination unit; and an error correction unit correcting a data value of a symbol on which negative result is obtained according to the determination by said second determination unit to the data value of said synchronization code if a ratio of the number of positive results A to the total number of determinations A+B made by said second determination unit, i.e. A/(A+B), exceeds a predetermined threshold.

4. An error correction device which corrects an error in a symbol string supplied via a data transmission line, comprising:

a first delay circuit delaying said supplied symbol string by a first time;

an error correction circuit performing a predetermined arithmetic operation on said supplied symbol string to correct an error in an output symbol string of said first delay circuit based on result of the arithmetic operation;

a determination circuit determining whether or not error correction performed by said error correction circuit is normal, outputting a first signal if the correction is normal and outputting a second signal if the correction is abnormal;

a holding circuit holding a number of a symbol corrected by said error correction circuit and a data value of the symbol before correction in the output symbol string of said first delay circuit;

a second delay circuit delaying the output symbol string of said first delay circuit corrected by said error correction circuit by a second time; and a re-correction circuit receiving an output symbol string of said second delay circuit to supply the output symbol string of said second delay circuit directly to a circuit in a following stage in response to output of the first signal from said determination circuit, and re-correcting a data value of the symbol having the number held by said holding circuit in the output symbol string of said second delay circuit to the data value before correction held by said holding circuit in response to output of the second signal from said determination circuit to supply a re-corrected symbol string to the circuit in the following stage.

5. The error correction device according to claim 4, wherein
a plurality of symbol strings are supplied in series,
each symbol string includes a predetermined number N of symbols,
a leading symbol in each symbol string is used as a synchronization code,
a synchronization control circuit which detects said synchronization code to control said error correction device in synchronization with said synchronization code is provided, and
said synchronization control circuit includes:
   a detection unit detecting a symbol having the same data value as that of said synchronization code; and
   a first determination unit determining an Nth symbol counted from a symbol next to the symbol detected by said detection unit as the leading symbol if the Nth symbol has the same data value as that of said synchronization code.

6. The error correction device according to claim 5, wherein said synchronization control circuit further includes:
   a second determination unit determining whether or not an Nth symbol counted from a symbol next to the symbol determined as the leading symbol by said first determination unit has the same data value as that of said synchronization code;
   a count unit counting the number of positive results A and the number of negative results B of the determination by said second determination unit; and
   an error correction unit correcting a data value of a symbol on which negative result is obtained according to the determination by said second determination unit to the data value of said synchronization code if a ratio of the number of positive results A to the total number of determinations A+B made by said second determination unit, i.e. A/(A+B), exceeds a predetermined threshold.

7. An error correction device which corrects an error in a symbol string supplied via a data transmission line, comprising:
   a first delay circuit delaying said supplied symbol string by a first time;
   an error correction circuit performing a predetermined arithmetic operation on said supplied symbol string to correct an error in an output symbol string of said first delay circuit based on result of the arithmetic operation;
   a determination circuit determining whether or not error correction performed by said error correction circuit is normal, outputting a first signal if the correction is normal and outputting a second signal if the correction is abnormal;
   a holding circuit holding a number of a symbol corrected by said error correction circuit and a data value of the symbol after correction in the output symbol string of said first delay circuit and holding a data value used for correcting the symbol;
   an arithmetic operation circuit calculating an original data value based on the data value after correction and the data value used for correction of the symbol that are held by said holding circuit;
   a second delay circuit delaying the output symbol string of said first delay circuit corrected by said error correction circuit by a second time; and
   a re-correction circuit receiving an output symbol string of said second delay circuit to supply the output symbol string of said second delay circuit directly to a circuit in a following stage in response to output of the first signal from said determination circuit, and re-correcting a data value of the symbol having the number held by said holding circuit in the output symbol string of said second delay circuit to the data value calculated by said arithmetic operation circuit in response to output of the second signal from said determination circuit to supply a re-corrected symbol string to the circuit in the following stage.

8. The error correction device according to claim 7, wherein
a plurality of symbol strings are supplied in series,
each symbol string includes a predetermined number N of symbols,
a leading symbol in each symbol string is used as a synchronization code,
a synchronization control circuit which detects said synchronization code to control said error correction device in synchronization with said synchronization code is provided, and
said synchronization control circuit includes:
   a detection unit detecting a symbol having the same data value as that of said synchronization code; and
   a first determination unit determining an Nth symbol counted from a symbol next to the symbol detected by said detection unit as the leading symbol if the Nth symbol has the same data value as that of said synchronization code.

9. The error correction device according to claim 8, wherein said synchronization control circuit further includes:
   a second determination unit determining whether or not an Nth symbol counted from a symbol next to the symbol determined as the leading symbol by said first determination unit has the same data value as that of said synchronization code;
   a count unit counting the number of positive results A and the number of negative results B of the determination by said second determination unit; and
   an error correction unit correcting a data value of a symbol on which negative result is obtained according to the determination by said second determination unit to the data value of said synchronization code if a ratio of the number of positive results A to the total number of determinations A+B made by said second determination unit, i.e. A/(A+B), exceeds a predetermined threshold.

* * * * *